United States Patent
Song et al.

(10) Patent No.: US 12,291,796 B2
(45) Date of Patent: May 6, 2025

(54) METHOD FOR GROWING SINGLE-CRYSTAL SILICON INGOTS AND SINGLE-CRYSTAL SILICON INGOTS

(71) Applicant: XI'AN ESWIN MATERIAL TECHNOLOGY CO., LTD., Xi'an (CN)

(72) Inventors: Zhenliang Song, Xi'an (CN); Shaojie Song, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/564,904

(22) PCT Filed: Oct. 28, 2022

(86) PCT No.: PCT/CN2022/128327
§ 371 (c)(1),
(2) Date: Nov. 28, 2023

(87) PCT Pub. No.: WO2023/093460
PCT Pub. Date: Jun. 1, 2023

(65) Prior Publication Data
US 2024/0263351 A1    Aug. 8, 2024

(30) Foreign Application Priority Data
Nov. 25, 2021 (CN) .......................... 202111411291.X

(51) Int. Cl.
| C30B 15/20 | (2006.01) |
| C30B 29/06 | (2006.01) |
| C30B 30/04 | (2006.01) |

(52) U.S. Cl.
CPC .............. *C30B 30/04* (2013.01); *C30B 15/20* (2013.01); *C30B 29/06* (2013.01)

(58) Field of Classification Search
CPC ......... C30B 15/00; C30B 15/20; C30B 29/06; C30B 30/04
See application file for complete search history.

(56) References Cited

U.S. PATENT DOCUMENTS

| 4,592,895 A | 6/1986 | Matsutani et al. |
| 5,306,387 A * | 4/1994 | Fusegawa ............. C30B 15/305 117/28 |

(Continued)

FOREIGN PATENT DOCUMENTS

| CN | 1763265 A | 4/2006 |
| CN | 111615569 A | 9/2020 |

(Continued)

OTHER PUBLICATIONS

European Patent Office, English computer translation of JP 2010-024120-A (Year: 2024).*

(Continued)

*Primary Examiner* — Matthew J Song
(74) *Attorney, Agent, or Firm* — Maginot, Moore & Beck

(57) ABSTRACT

A method for growing a single-crystal silicon ingot and a single-crystal silicon ingot includes, during an initial stage of body growing process of the single-crystal silicon ingot, controlling an initial height of a horizontal magnetic field to be higher than a free surface of silicon melt. The method further includes, during the body growing process of the single-crystal silicon ingot, adjusting the horizontal magnetic field on convection intensity of the silicon melt to make oxygen concentration of the single-crystal silicon ingot to be decreased in an axial direction from a head portion to a tail portion.

5 Claims, 4 Drawing Sheets

(56) References Cited

U.S. PATENT DOCUMENTS

| | | | |
|---|---|---|---|
| 5,359,959 | A | 11/1994 | Fusegawa et al. |
| 2010/0170432 | A1 | 7/2010 | Furukawa |
| 2018/0237939 | A1 | 8/2018 | Song et al. |
| 2019/0017191 | A1* | 1/2019 | Kang .................... C30B 15/305 |

FOREIGN PATENT DOCUMENTS

| | | | | |
|---|---|---|---|---|
| CN | 114086241 | A | | 2/2022 |
| JP | S6027682 | A | | 2/1985 |
| JP | 2004196569 | A | | 7/2004 |
| JP | 2007204312 | A | | 8/2007 |
| JP | 2007210865 | A | * 8/2007 | ............. C30B 29/06 |
| JP | 2010024120 | A | * 2/2010 | ............. C30B 29/06 |
| KR | 20170089702 | A | | 8/2017 |
| KR | 20190135913 | A | | 12/2019 |
| KR | 20200086019 | A | | 7/2020 |

OTHER PUBLICATIONS

European Patent Office, English computer translation of JP-2007210865-A (Year: 2024).*
Korean Office Action corresponding to Korean Application No. 10-2023-7038383, dated Jan. 16, 2024. (7 pages).
English Translation of Korean Office Action corresponding to Korean Application No. 10-2023-7038383, dated Jan. 16, 2024. (6 pages).
Machine English Translation of KR20170089702A. (12 Pages).
Machine English Translation of KR20190135913A. (36 Pages).
Machine English Translation of KR20200086019A. (17 Pages).
Written Opinion and International Search Report of the International Search Authority corresponding to International Application No. PCT/CN2022/128327, dated Dec. 15, 2022. (10 pages).
English Translation of Written Opinion and International Search Report of the International Search Authority corresponding to International Application No. PCT/CN2022/128327, dated Dec. 15, 2022. (5 pages).
Chinese Office Action corresponding to Chinese Patent Application No. 202111411291.X dated Jul. 15, 2022. (7 Pages).
English Translation of Chinese Office Action corresponding to Chinese Patent Application No. 202111411291.X dated Jul. 15, 2022. (3 Pages).
Machine English Translation of CN1763265A. (5 Pages).
Machine English Translation of JP2004196569A. (7 Pages).
Machine English Translation of CN114086241A. (13 Pages).
Machine English Translation of CN111615569A. (19 Pages).
Machine English Translation of JP2007204312A. (8 Pages).
2nd Chinese Office Action corresponding to Chinese Patent Application No. 202111411291.X dated Oct. 31, 2022 (5 Pages).
English Translation of 2nd Chinese Office Action corresponding to Chinese Patent Application No. 202111411291.X dated Oct. 31, 2022 (7 Pages).
Japanese Office Action corresponding to Japanese Application No. 2023-569755, dated Jun. 6, 2024. (4 pages).
English Translation of Japanese Office Action corresponding to Japanese Application No. 2023-569755, dated Jun. 6, 2024. (4 pages).
German Office Action corresponding to German Application No. 11 2022 002 214.0, dated Aug. 8, 2024. (6 pages).
English Translation of German Office Action corresponding to German Application No. 11 2022 002 214.0, dated Aug. 8, 2024. (7 pages).
Machine English Translation of JP2010024120A. (18 Pages).

* cited by examiner

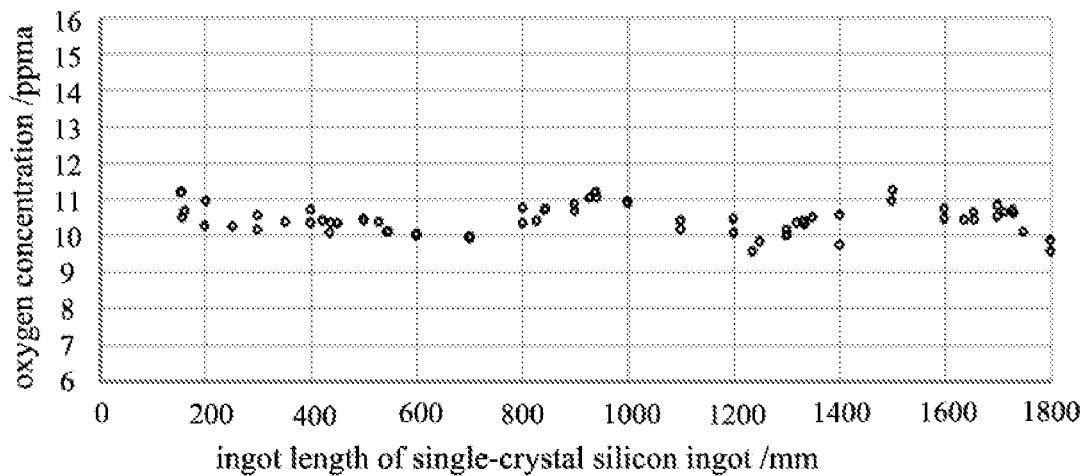

Fig. 3 during an initial stage of body growing process of the single-crystal silicon ingot, setting an initial height of a horizontal magnetic field to be higher than a free surface of silicon melt. — S401 during an body growing process of the single-crystal silicon ingot, adjusting the horizontal magnetic field to control a convection intensity of the silicon melt to make oxygen concentration of the single-crystal silicon ingot to be decreased in an axial direction from a head portion to a tail portion. — S402

Fig. 4

METHOD FOR GROWING SINGLE-CRYSTAL SILICON INGOTS AND SINGLE-CRYSTAL SILICON INGOTS

CROSS-REFERENCE TO RELATED APPLICATION

This application is the U.S. national phase of PCT Application No. PCT/CN2022/128327 filed on Oct. 28, 2022, which claims a priority of the Chinese patent application No. 202111411291.X filed on Nov. 25, 2021, both disclosures are incorporated in their entirety by reference herein.

TECHNICAL FIELD

The present disclosure relates to the field of semiconductor manufacturing technology, in particular to a method for growing a single-crystal silicon ingot and a single-crystal silicon ingot.

BACKGROUND

In recent years, with the development of miniaturization in semiconductor device manufacturing, the requirements on silicon wafer are increasing, it is not only required that there is few or no defects in a surface region of the silicon wafer, but also required that there are sufficient bulk micro defects (BMDs) in the silicon wafer, so as to protect a silicon wafer region where electronic elements are arranged from contamination by heavy metal impurities.

Epitaxial silicon wafer represents a single-crystal layer (also called epitaxial layer) grown on the silicon wafer by vapor deposition. Due to high crystalline integrity and almost no defects, the epitaxial layer is widely used as a substrate material of semiconductor devices. However, the heavy metal impurities in the silicon wafer have become an important factor affecting the quality of the semiconductor devices, so it is necessary to greatly reduce the content of the heavy metal impurities during the production process of silicon wafers. At present, it is known that when there are sufficient BMDs formed in a silicon wafer, these BMDs have an intrinsic gettering (IG) effect for capturing the heavy metal impurities, which is able to greatly solve the problem of poor quality of the semiconductor devices caused by the heavy metal impurities. However, during the epitaxial growth process, due to the exposure of the silicon wafer to high-temperature environments above 1000 degrees, small BMD cores will be eliminated, resulting in insufficient BMD cores provided in the epitaxial silicon wafer, and resulting in a case where a sufficient density of the BMDs may not be induced when manufacturing a semiconductor device by the above epitaxial silicon wafer, thereby leading to poor quality of the manufactured semiconductor device.

In order to solve the problem of decreasing of the density of the BMDs in the epitaxial silicon wafer, a nitrogen doping treatment is generally adopted during the single-crystal silicon ingot is grown to obtain stable BMD cores, but the density of the BMDs in a nitrogen-doped single-crystal silicon ingot increase along with the increase of nitrogen concentration. According to the different process requirements of customers for semiconductor devices, the requirements for BMD density uniformity are more and more stringent. In this case, a whole single-crystal silicon ingot may not meet the process requirements of specific customers without loss, resulting in low productivity and high cost.

SUMMARY

Embodiments of the present disclosure is to provide a method for growing a single-crystal silicon ingot and a single-crystal silicon ingot, so as to control oxygen concentration of the single-crystal silicon ingot to be gradually decreased in an axial direction from a head portion to a tail portion, thereby the BMD density distribution in the axial direction of the single-crystal silicon ingot was more uniform compared to the related technology.

The present disclosure is implemented as follows.

In one aspect, the present disclosure provide a method for growing a single-crystal silicon ingot, comprising: during an initial stage of body growing process of the single-crystal silicon ingot, an initial height of a horizontal magnetic field is higher than a free surface of silicon melt; and during the body growing process of the single-crystal silicon ingot, an convection intensity of the silicon melt is controlled by adjusting a height or intensity of horizontal magnetic field, so that oxygen concentration of the single-crystal silicon ingot in an axial direction from a head portion to an tail portion tends to decrease.

In another aspect, the present disclosure provide a single-crystal silicon ingot, which is grown by the above-mentioned method.

According to the present disclosure, a method for growing a single-crystal silicon ingot and a single-crystal silicon ingot is produced thereof. During the initial stage of the body growing process of the single-crystal silicon ingot, the horizontal magnetic field is arranged at a position higher than the free surface of the silicon melt; and during the body growing process, the oxygen concentration of the single-crystal silicon ingot is decreased in the axial direction from the head portion to the tail portion through adjusting the height or the intensity of the horizontal magnetic field, so as to suppress the increase of BMD density caused by segregation of nitrogen concentration, thereby the BMD density distribution in the axial direction of the single-crystal silicon ingot is uniform.

BRIEF DESCRIPTION OF THE DRAWINGS

FIG. 3 is a schematic view showing a variation trend of oxygen concentration of a corresponding single-crystal silicon ingot in an axial direction from a head portion to an tail portion according to one embodiment of the present disclosure;

FIG. 4 is a flow chart of a method for growing a single-crystal silicon ingot according to one embodiment of the present disclosure;

DETAILED DESCRIPTION

The technical solutions according to embodiments of the present disclosure will be described hereinafter in a clear and complete manner in conjunction with the drawings and embodiments.

Figure 1:
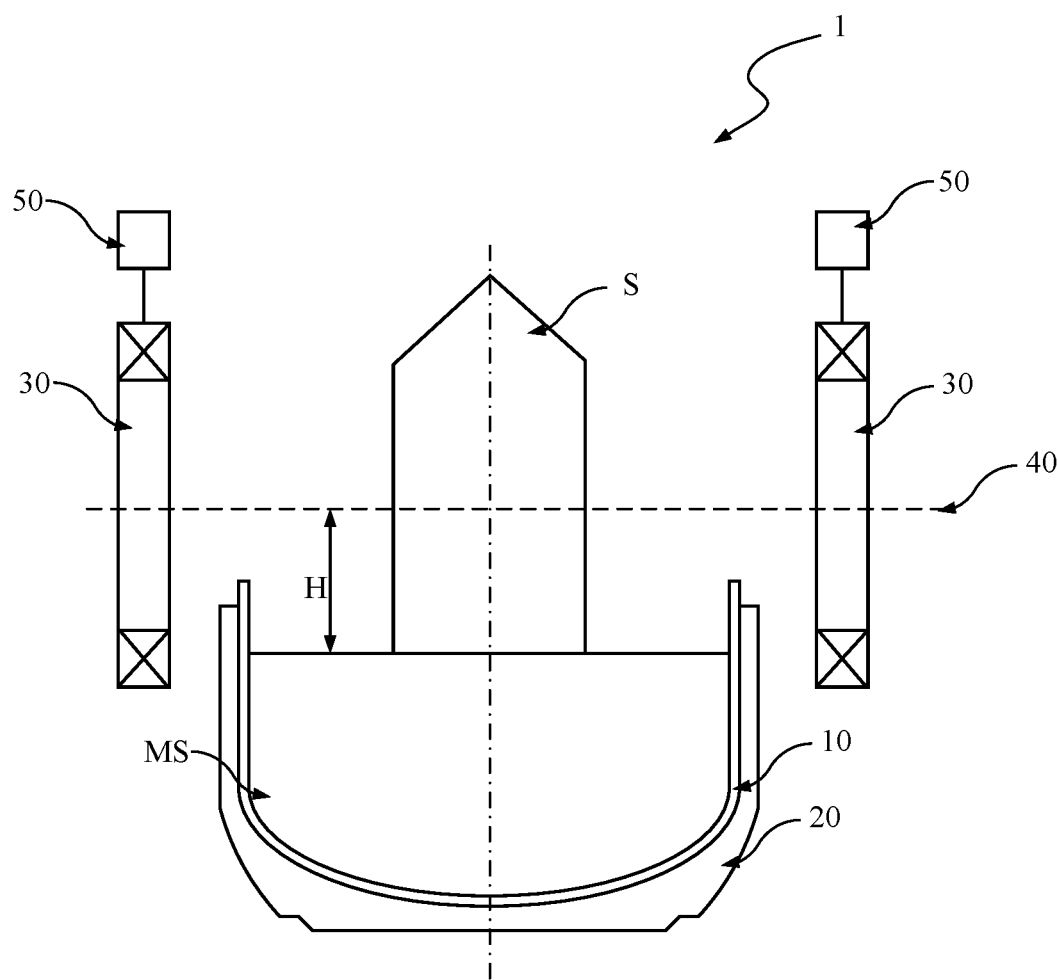
FIG. 1 is a schematic view showing a structure of a crystal growing apparatus according to one embodiment of the present disclosure.

FIG. 1 shows a structure of a crystal growing apparatus 1 in the embodiments of the present disclosure. As shown in FIG. 1, the crystal growing apparatus 1 mainly comprises a quartz crucible 10 and a graphite crucible 20, and the graphite crucible 20 is used to support and fix the quartz crucible 10. It should be appreciated that, the crystal growing apparatus 1 shown in FIG. 1 may further comprise other structures not shown in FIG. 1, such as a crucible lifting apparatus, in the embodiments of the present disclosure is not described in detail.

Figure 2:
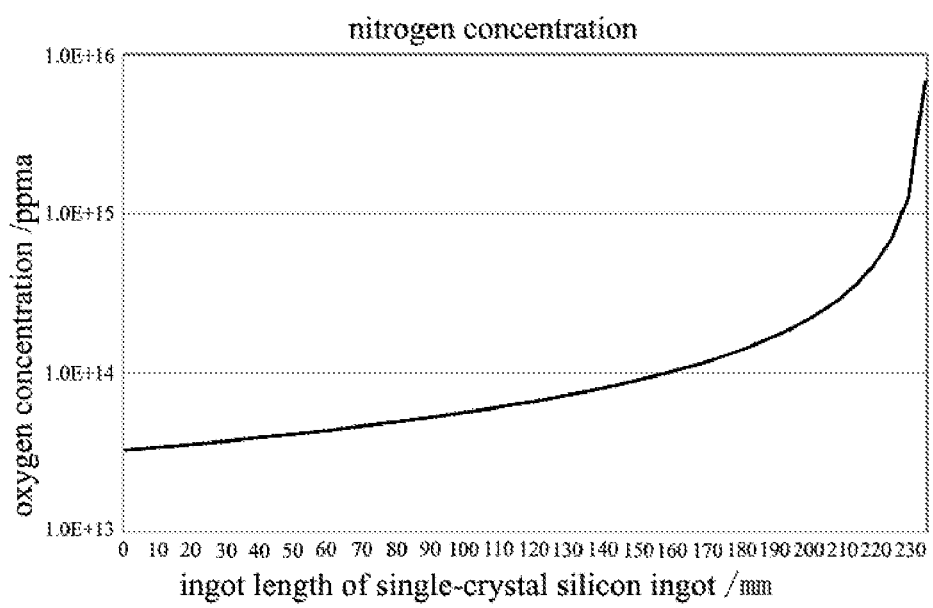
FIG. 2 is a schematic view showing a variation trend of nitrogen concentration with an ingot length of the single-crystal silicon ingot according to one embodiment of the present disclosure.

When a nitrogen-doped single-crystal silicon ingot S is grown through the above crystal growing apparatus 1, the nitrogen concentration at an initial stage of crystal growth of the single-crystal silicon ingot S is a predetermined target concentration during the crystal growth process. As the crystal growth continues, the nitrogen concentration in the single-crystal silicon ingot gradually increases with the increase of an ingot length of the single-crystal silicon ingot S due to the segregation of nitrogen, as shown in FIG. 2. Therefore, BMD density in the single-crystal silicon ingot S obtained by growing is gradually increased in an axial direction from a head portion to a tail portion. It is known from the related art that, the higher the oxygen concentration in the single-crystal silicon ingot S, the higher the BMD density therein, so it is able to control a variation trend of the oxygen concentration in the single-crystal silicon ingot S to suppress the increase of the BMD density in the axial direction of the single-crystal silicon ingot S.

At present, in a method for growing a single-crystal silicon ingot S based on a Czochralski (CZ) method, the variation trend of the oxygen concentration in the single-crystal silicon ingot S is adjusted by process recipes, such as adjusting a rotate speed of the quartz crucible or a flow rate of argon gas. However, these process recipes are difficult to make the oxygen concentration show an opposite changing trend to the nitrogen concentration. Generally, the oxygen concentration fluctuates in a certain range from the head portion to the tail portion of the single-crystal silicon ingot S, and as shown in FIG. 3, the decrease in the oxygen concentration is also limited.

Based on the above, as shown in FIG. 4, embodiments of the present disclosure provide a method for growing a single-crystal silicon ingot, including the following steps.

S401: during an initial stage of body growing process of the single-crystal silicon ingot, setting an initial height of a horizontal magnetic field to be higher than a free surface of silicon melt.

S402: during a body growing process of the single-crystal silicon ingot, adjusting the horizontal magnetic field to control a convection intensity of the silicon melt to make oxygen concentration of the single-crystal silicon ingot to be decreased in an axial direction from a head portion to a tail portion.

According to the technical solution in FIG. 4, during the initial stage of the body growing process of the single-crystal silicon ingot S, the horizontal magnetic field is arranged at a position higher than the free surface of the silicon melt MS; and during the body growing process, and the degree of the convection of the silicon melt MS is decreased by adjusting the horizontal magnetic field to control a convection intensity of the silicon melt MS, resulting in a decrease in the oxygen concentration at the free surface of the silicon melt MS, it is able to make the oxygen concentration of the single-crystal silicon ingot S gradually decreased in the axial direction from the head portion to the tail portion, so as to suppress the increase of the BMD density caused by segregation of nitrogen concentration, thereby the BMD density distribution in the axial direction of the single-crystal silicon ingot S is more uniform compared to the related technology.

It should be appreciated that, in the embodiments of the present disclosure, the head portion of the single-crystal silicon ingot S refers to a portion of the single-crystal silicon ingot S obtained by growing during the initial stage of the body growing, and the tail portion of the single-crystal silicon ingot S refers to a portion of the single-crystal silicon ingot S obtained by growing during the end stage of the body growing process.

Figure 5:
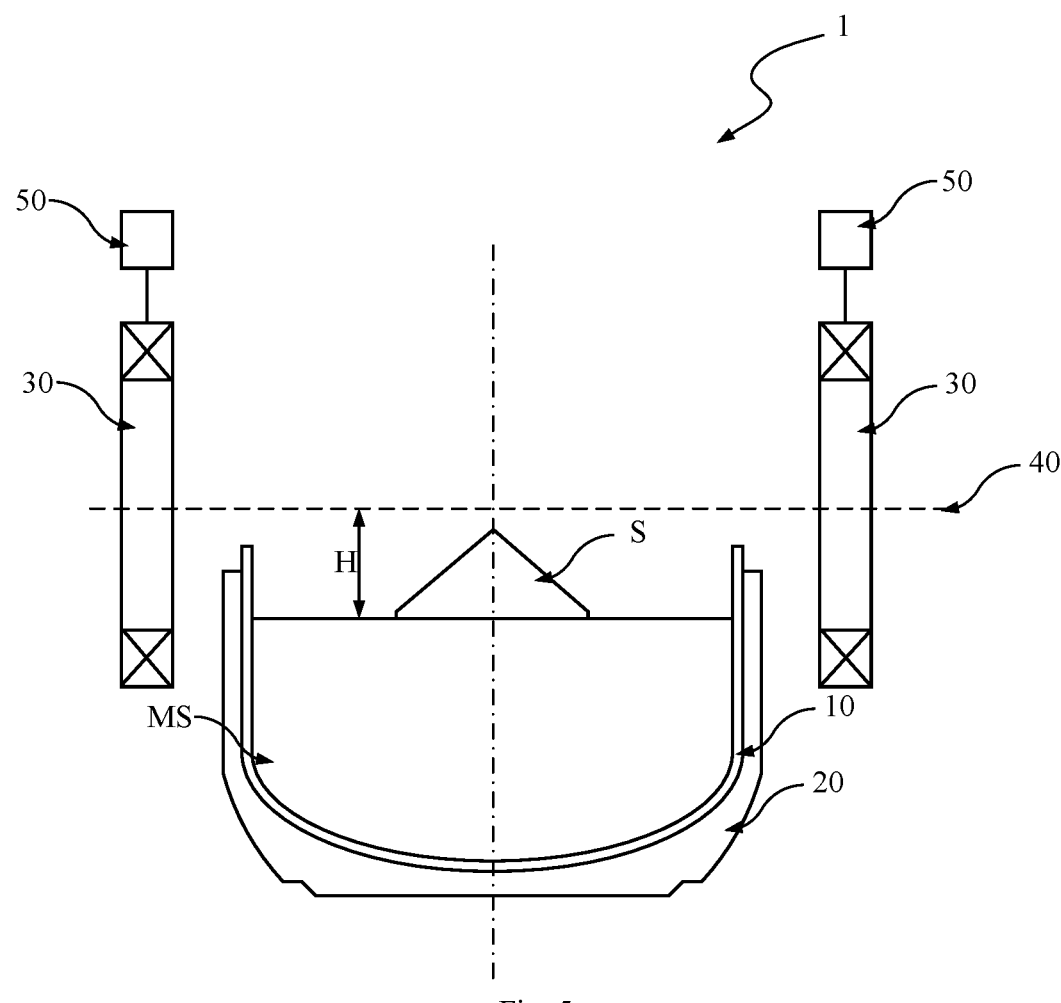
FIG. 5 is a schematic view showing a height of a horizontal magnetic field during an initial stage of body growing process of the single-crystal silicon ingot according to one embodiment of the present disclosure.

It should be appreciated that, in the embodiments of the present disclosure, as shown in FIG. 5, a pair of excitation coils 30 may be arranged around the graphite crucible 20 to apply the horizontal magnetic field to the silicon melt MS in the quartz crucible 10, a dashed line in FIG. 5 represents a horizontal plane 40 of the horizontal magnetic field. In the embodiments of the present disclosure, a distance H between the horizontal plane 40 and the free surface of the silicon melt MS is used to represent a position of the horizontal magnetic field, i.e., Maximum Gauss Position (MGP). It should be appreciated that, the horizontal magnetic field is a three-dimensional structure occupying a certain space, and the MGP refers to a middle position of the entire horizontal magnetic field.

It should be appreciated that, in the embodiments of the present disclosure, if the horizontal plane 40 of the horizontal magnetic field coincides with the free surface of the silicon melt MS, a height of the horizontal magnetic field is 0; and if the horizontal plane 40 of the horizontal magnetic field is higher than the free surface of the silicon melt MS, the height of the horizontal magnetic field is greater than 0. For example, when the horizontal plane 40 of the horizontal magnetic field is 100 mm higher than the free surface of the silicon melt MS, the height of the horizontal magnetic field is +100 mm. If the horizontal plane 40 of the horizontal magnetic field is lower than the free surface of the silicon melt MS, the height of the horizontal magnetic field is less than 0. For example, when the horizontal plane 40 of the horizontal magnetic field is 100 mm lower than the free surface of the silicon melt MS, the height of the horizontal magnetic field is −100 mm.

In addition, it should be appreciated that, in the embodiments of the present disclosure, the control of the horizontal magnetic field on the convection intensity of the silicon melt MS refers to a characteristic parameter of the degree of control of the horizontal magnetic field on the convection of the silicon melt MS. When the control of the horizontal magnetic field on the convection intensity of the silicon melt MS is increased, the degree of the convection of the silicon melt MS is decreased, the oxygen concentration at the free surface of the silicon melt MS is decreased, it is able to make the oxygen concentration of the single-crystal silicon ingot S gradually decreased in the axial direction from the head portion to the tail portion. For example, in the embodiments of the present disclosure, as shown in FIG. 5, during the initial stage of the body growing process of the single-crystal silicon ingot S, when the horizontal plane 40 of the horizontal magnetic field is higher than the free surface of the silicon melt MS, the quartz crucible 10 is always ascended during the single-crystal silicon ingot S is grown, so that the free surface of the silicon melt MS is substantially maintained at a same level. In this case, it is able to enhance the degree of control of the horizontal magnetic field P on the convection of the silicon melt MS by decreasing the height of the horizontal magnetic field or increasing the magnetic field intensity of the horizontal magnetic field.

Optionally, in the embodiments of the present disclosure, with respect to decreasing the height of the horizontal magnetic field, during a body growing process of the single-crystal silicon ingot, controlling the horizontal magnetic field on convection intensity of the silicon melt to control oxygen concentration of the single-crystal silicon ingot to be decreased in an axial direction from a head portion to a tail portion, comprises: during the body growing process of the single-crystal silicon ingot, maintaining a magnetic field intensity of the horizontal magnetic field being constant, and decreasing a height of the horizontal magnetic field gradually to increase the control of the horizontal magnetic field on the convection intensity of the silicon melt, so as to control the oxygen concentration of the single-crystal silicon ingot to be decreased in the axial direction from the head portion to the tail portion.

To be specific, as shown in FIG. 5, in order to adjust the height of the horizontal magnetic field, the crystal growing apparatus 1 further comprises a magnet moving unit 50, used to move the excitation coils 30 to adjust the height of the horizontal magnetic field during the single-crystal silicon ingot S is grown.

Figure 6:
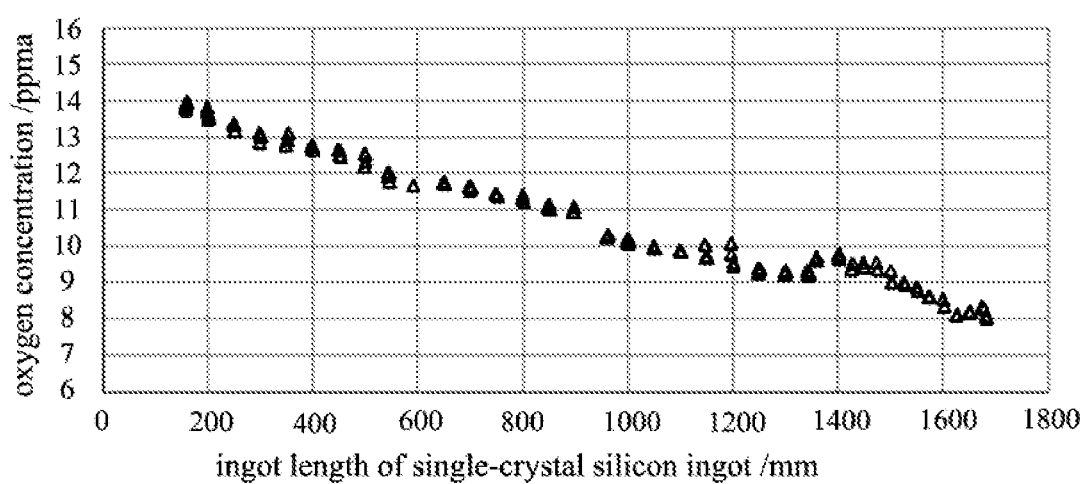
FIG. 6 is a schematic view showing a variation trend of the oxygen concentration of the single-crystal silicon ingot in the axial direction from the head portion to the tail portion in a case that a magnetic field intensity of the horizontal magnetic field is constant, and a height of the horizontal magnetic field is gradually decreased during the body growing process of the single-crystal silicon ingot according to one embodiment of the present disclosure.

To be specific, FIG. 6 shows a decreasing trend of the oxygen concentration of the single-crystal silicon ingot in the axial direction from the head portion to the tail portion in a case that the magnetic field intensity of the horizontal magnetic field is constant, and a height of the horizontal magnetic field is gradually descending.

In a possible embodiment of the present disclosure, a descending rate of the horizontal magnetic field ranges from 0.02 mm/h to 0.12 mm/h.

In a possible embodiment of the present disclosure, the method further comprises: during an end stage of the body growing process of the single-crystal silicon ingot, controlling the height of the horizontal magnetic field to be not lower than the free surface of the silicon melt. That is, during the end stage of the body growing process of the single-crystal silicon ingot S, the minimum height of the horizontal plane 40 of the horizontal magnetic field is coincident with the free surface of the silicon melt MS, i.e., the minimum height of the horizontal magnetic field is 0. Of course, during the end stage of the body growing process of the single-crystal silicon ingot S, the height of the horizontal magnetic field may be greater than 0.

Optionally, in the embodiments of the present disclosure, with respect to increasing the magnetic field intensity of the horizontal magnetic field, during a body growing process of the single-crystal silicon ingot, adjusting the horizontal magnetic field to control a convection intensity of the silicon melt to make oxygen concentration of the single-crystal silicon ingot to be decreased in an axial direction from a head portion to a tail portion, comprises: during the body growing process of the single-crystal silicon ingot, main- taining a height of the horizontal magnetic field being constant, and increasing a magnetic field intensity of the horizontal magnetic field gradually to increase the control of the horizontal magnetic field on the convection intensity of the silicon melt, so as to control the oxygen concentration of the single-crystal silicon ingot to be decreased in the axial direction from the head portion to the tail portion.

For example, in the embodiments of the present disclosure, in order to increase the magnetic field intensity of the horizontal magnetic field, it is able to increase an input current of the excitation coils 30.

Figure 7:
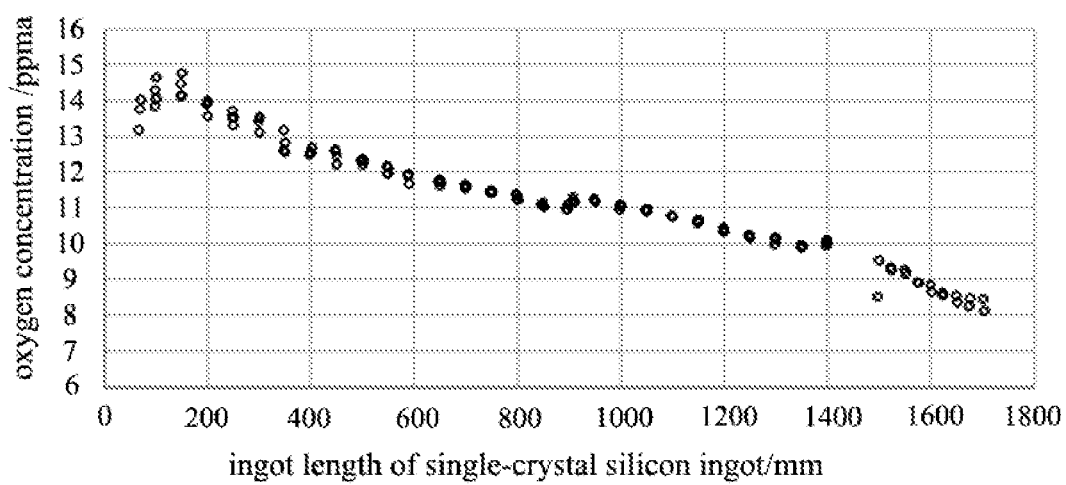
FIG. 7 is a schematic view showing a variation trend of the oxygen concentration of the single-crystal silicon ingot in the axial direction from the head portion to the tail portion in a case that a height of the horizontal magnetic field is constant, and a magnetic field intensity of the horizontal magnetic field is gradually increased during the body growing process of the single-crystal silicon ingot according to one embodiment of the present disclosure.

To be specific, FIG. 7 shows a decreasing trend of the oxygen concentration of the single-crystal silicon ingot S in the axial direction from the head portion to the tail portion in a case that the height of the horizontal magnetic field is constant, and a magnetic field intensity of the horizontal magnetic field is gradually increased.

In a possible embodiment of the present disclosure, an increasing frequency of the magnetic field intensity of the horizontal magnetic field ranges from 0.2 G/h to 0.6 G/h.

In a possible embodiment of the present disclosure, the method further comprises: during an end stage of the body growing process of the single-crystal silicon ingot S, controlling the magnetic field intensity of the horizontal magnetic field to be not more than 4000 gauss (G). That is, in the embodiments of the present disclosure, in order to facilitate the growth of the single-crystal silicon ingot S, the magnetic field intensity of the horizontal magnetic field is not more than 4000 G during the end stage of the body growing of the single-crystal silicon ingot S.

Optionally, in the embodiments of the present disclosure, with respect to the single-crystal silicon ingot with a diameter of 300 mm, an initial height of the horizontal magnetic field is +100 mm to +200 mm, and the magnetic field intensity of the horizontal magnetic field is 3000 G to 4000 G during the initial stage of the body growing process of the single-crystal silicon ingot.

In one aspect, in the embodiments of the present disclosure, when a single-crystal silicon ingot S with a diameter of 300 mm is grown, during the initial stage of the body growing process, the initial height of the horizontal magnetic field is +100 mm to +200 mm, and the magnetic field intensity of the horizontal magnetic field is 3000 G to 4000 G; and during the body growing process, maintaining the magnetic field intensity of the horizontal magnetic field to be constant, and meanwhile the height of the horizontal magnetic field is gradually descended at a descending rate from 0.02 mm/h to 0.12 mm/h to make the horizontal plane 40 of the horizontal magnetic field to gradually close to the free surface of the silicon melt MS, so as to increase the control of the horizontal magnetic field on the convection intensity of the silicon melt MS and decrease the degree of the convection of the silicon melt MS, thereby the oxygen concentration of the single-crystal silicon ingot S is gradually decreased in the axial direction from the head portion to the tail portion. During the end stage of the body growing process, the minimum height of the horizontal plane 40 is coincident with the free surface of the silicon melt MS.

In another aspect, in the embodiments of the present disclosure, when a single-crystal silicon ingot S with a diameter of 300 mm is grown, during the initial stage of the body growing process, the initial height of the horizontal magnetic field is +100 mm to +200 mm, and the magnetic field intensity of the horizontal magnetic field is 3000 G to 4000 G; and during the body growing process, the height of the horizontal magnetic field is constant, the magnetic field intensity of the horizontal magnetic field is gradually increased at an increasing frequency from 0.2 G/h to 0.6 G/h, so as to increase the control of the horizontal magnetic field on the convection intensity of the silicon melt MS and decrease the degree of the convection of the silicon melt MS, thereby oxygen concentration of the single-crystal silicon ingot S is gradually decreased in the axial direction from the head portion to the tail portion. During the end stage of the body growing process, the magnetic field intensity of the horizontal magnetic field is not more than 4000 G.

Finally, the present disclosure further provides in some embodiments a single-crystal silicon ingot, manufactured by the above-mentioned method.

It should be appreciated that, the technical solutions in any embodiments of the present disclosure may be combined without conflict.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for growing a single-crystal silicon ingot, comprising:
during an initial stage of body growing process of the single-crystal silicon ingot, setting an initial height of a horizontal magnetic field to be higher than a free surface of silicon melt; and
during the body growing process of the single-crystal silicon ingot, controlling the horizontal magnetic field on convection intensity of the silicon melt to control oxygen concentration of the single-crystal silicon ingot to be decreased in an axial direction from a head portion to a tail portion;
wherein during the body growing process of the single-crystal silicon ingot, controlling the horizontal magnetic field on the convection intensity of the silicon melt to control oxygen concentration of the single-crystal silicon ingot to be decreased in an axial direction from a head portion to a tail portion, comprises:
during the body growing process of the single-crystal silicon ingot, a height of the horizontal magnetic field being constant, increasing a magnetic field intensity of the horizontal magnetic field gradually to increase the control of the horizontal magnetic field on the convection intensity of the silicon melt, so as to control the oxygen concentration of the single-crystal silicon ingot to be decreased in the axial direction from the head portion to the tail portion; wherein an increasing frequency of the magnetic field intensity of the horizontal magnetic field ranges from 0.2 G/h to 0.6 G/h.

2. The method according to claim 1, further comprising:
during an end stage of the body growing process of the single-crystal silicon ingot, controlling the height of the horizontal magnetic field to be not lower than the free surface of the silicon melt.

3. The method according to claim 1, further comprising:
during an end stage of the body growing process of the single-crystal silicon ingot, controlling the magnetic field intensity of the horizontal magnetic field to be not more than 4000 G.

4. The method according to claim 1, wherein for a single-crystal silicon ingot with a diameter of 300 mm during the initial stage of the body growing process of the single-crystal silicon ingot, an initial height of the horizontal magnetic field is set within a range from +100 mm to +200 mm, and the magnetic field intensity of the horizontal magnetic field is set within 3000 G to 4000 G.

5. A single-crystal silicon ingot, manufactured by the method according to claim 1.

* * * * *